United States Patent
Dumas et al.

(10) Patent No.: US 7,601,636 B2
(45) Date of Patent: Oct. 13, 2009

(54) IMPLEMENTATION OF A METAL BARRIER IN AN INTEGRATED ELECTRONIC CIRCUIT

(75) Inventors: Laurin Dumas, Saint Martin d'Heres (FR); Cécile Jenny, Challes les Eaux (FR); Pierre Caubet, Le Versoud (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 11/871,860

(22) Filed: Oct. 12, 2007

(65) Prior Publication Data
US 2008/0088022 A1    Apr. 17, 2008

(30) Foreign Application Priority Data
Oct. 13, 2006    (FR)    ................................. 06 09038

(51) Int. Cl.
*H01L 213/4763*    (2006.01)

(52) U.S. Cl. ....................... 438/643; 438/645

(58) Field of Classification Search .......... 257/E21.199, 257/E21.302, 775, 776, 649; 438/637, 641, 438/643, 649
See application file for complete search history.

(56) References Cited

U.S. PATENT DOCUMENTS

| | | | |
|---|---|---|---|
| 6,797,598 B2 * | 9/2004 | Lim et al. | 438/586 |
| 6,844,258 B1 | 1/2005 | Fair et al. | |
| 6,962,873 B1 * | 11/2005 | Park | 438/627 |
| 2002/0074664 A1 * | 6/2002 | Nogami et al. | 257/764 |

OTHER PUBLICATIONS

Noda, et al., "Selective Silicidation of Co Using Silane or Disilane for Anti-Oxidation Barrier Layer in Cu Metallication," Japanese Journal of Applied Physics, vol. 43, No. 9A, Sep. 2004, pp. 6001-6007; XP002432923.
Preliminary French Search Report and Written Opinion, FR 06 09038, dated May 10, 2007.

* cited by examiner

*Primary Examiner*—Steven Loke
*Assistant Examiner*—Kimberly M Thomas
(74) *Attorney, Agent, or Firm*—Gardere Wynne Sewell LLP

(57) ABSTRACT

A metal barrier is realized on top of a metal portion of a semiconductor product, by forming a metal layer on the surface of the metal portion, with this metal layer comprising a cobalt-based metal material. Then, after an optional deoxidation step, a silicidation step and a nitridation step of the cobalt-based metal material of the metal layer are performed. The antidiffusion properties of copper atoms (for example) and the antioxidation properties of the metal barrier are improved.

17 Claims, 6 Drawing Sheets

IMPLEMENTATION OF A METAL BARRIER IN AN INTEGRATED ELECTRONIC CIRCUIT

PRIORITY CLAIM

The present application is a translation of and claims priority from French Patent Application No. 06 09038 of the same title filed Oct. 13, 2006, the disclosure of which is hereby incorporated by reference to the maximum extent allowable by law.

BACKGROUND OF THE INVENTION

1. Technical Field of the Invention

The present invention relates to the implementation of metal barriers in integrated electronic circuits.

2. Description of Related Art

Integrated circuits generally comprise such metal barriers at the interface between a conductive zone (typically a metal line or via in a multilayered interconnect structure) and an insulating zone (typically a dielectric layer in such a structure). These barriers prevent the diffusion of atoms from the conductive zone to the insulating zone, which can be the origin of integrated circuit malfunctions such as short-circuits between metal lines. This is why these barriers are commonly called "metal caps."

Such metal barriers can also act as conductive passivation layers to mitigate the weak antioxidation properties of a conductive material such as copper (Cu).

These two functions, the antidiffusion and antioxidation functions, are combined.

Such metal barriers are generally realized of a material based on titanium (Ti) or tantalum (Ta).

It has also been proposed to use cobalt (Co), or metal compounds based on cobalt, as a material for realizing these metal barriers. In what follows, such compounds are denoted as Co-M, where the letter M indicates a metal which in particular can be tungsten (W), phosphorus (P), boron (B), or a combination of these metals. It is advantageous for such a material to be selectively deposited and self-aligned by an electroless process. In this process, the self-aligned barriers comprising cobalt are manufactured by placing the wafer in a solution. The solution reacts with the copper such that the barrier only forms on the surface of the copper. This type of process therefore only requires preparing the wafer surface and controlling certain parameters such as the temperature and pH.

In particular, an alloy of cobalt and tungsten-phosphorus (denoted Co—WP and called "cobalt-tungsten-phosphorus") is known to be a good candidate for realizing self-aligned barriers (SAB). Co—WP improves the electromigration properties of the conductive zones of the interconnect structures in circuits using CMOS technology (Complementary Metal-Oxide Semiconductor), resulting in high performance circuits. It is also an economical solution for realizing CMOS imagers, with the added advantage of increasing the optical gain.

In practice, however, a cobalt-based metal barrier tends to oxidize, particularly when it is exposed to ambient oxidants during later steps involving the deposition of a dielectric material, the plasma etching of this material, etc., as the semiconductor fabrication process continues.

The effect of this undesired oxidation is illustrated in FIG. 1, which is a partial view of an interconnect structure of a semiconductor product with two metallization levels.

The first and second metallization levels of the interconnect structure, respectively labeled M1 and M2, are realized in respective layers of a dielectric material 10. This dielectric material can be of undoped silicon dioxide ($SiO_2$) (USG, for "undoped silicon glass"), tetraethoxysilane (TEOS), fluorosilicate glass (FSG), BD2X™, etc. Level M1 comprises a metal line 11. Level M2 comprises a metal line 12 as well as a via 13 connecting the line 12 to the line 11 in the lower level. These metal elements 11, 12 and 13 are of copper for example, but they can also be of another metal such as aluminum (Al). Before the deposition of the metal constituting the line 11 (or the line 12 and the via 13), the walls of the corresponding trench in the dielectric material 10 of the level M1 (or the level M2 respectively) are spray coated with tantalum (Ta), with said tantalum then at least partially nitrided to result in a metal cap or antidiffusion barrier 14 (or 17 respectively) comprising tantalum nitride and tantalum (TaN/Ta). Similarly, a metal self-aligned barrier based on cobalt 15 is formed before the deposition of the dielectric material 10 of the level M2. During the deposition and etching of the dielectric material 10 of the level M2, a partial or complete oxidation of the Co-M of the layer 15 may occur such that a metal oxide layer 16 (Co-M-$O_x$) is formed on top of the layer 15. In extreme cases, the copper of the underlying conductive line 11 can also oxidize to form a layer 18 of copper dioxide ($CuO_2$).

These undesired oxidations can result in:

an increase in the electrical resistance of the material forming the metal barrier, and therefore an increase in the electrical resistance of the vias, a decrease in the antidiffusion properties of the metal barrier preventing the diffusion of copper atoms, the formation of voids when wet cleaning is performed after plasma etching the via; such cleaning is well known to a person skilled in the art, and is intended to remove the polymer residues formed during the etching step, particularly at the edge of the vias; however, such cleaning may cause the removal of the Co-M, particularly if it is in oxidized form (Co-M-$O_x$), and create voids (labeled with the number 19 in the diagram in FIG. 2) which can result in integrity failure of the metal cap 17, appearing as a flaw in said cap (designated by the circle 20 in the diagram in FIG. 2), and a decrease in performance in terms of electromigration.

It is known that metal silicides have better antioxidation properties than their pure metal counterparts. For example, tungsten silicide ($WSi_2$) is less sensitive to oxidation than tungsten. In addition, the metal silicide layer formed on the surface of the copper when a self-aligned barrier comprising silicon is formed, allows better retention of the copper atoms when a relatively high current is applied to the circuit, which means the resistance against electromigration is also improved.

Selective silicidation of pure cobalt for an antioxidation barrier in copper-based metallization is known, for example in the article "Selective silicidation of Co using silane or disilane for anti-oxidation barrier layer in Cu metallization", S. Noda, R. Hirai, H. Komiyama, and Y. Shimogaki, Japanese Journal of Applied Physics, Vol. 43, No. 9A, pp. 6001-6007 (2004).

However, even after the incorporation of silicon atoms by a silicidation process, the cobalt-based metal compound Co-M continues to undergo some oxidation (although to a lesser extent) in the context described above, and the diffusion of copper atoms across this barrier is not completely prevented either.

This is why the need exists to further improve the antioxidation properties and the resistance to the diffusion of copper atoms in cobalt-based metal barriers used in the manufacture of certain integrated circuit structures.

SUMMARY OF THE INVENTION

In an embodiment, a process for forming a metal barrier on top of a metal portion of a semiconductor product, comprises: forming a metal layer on the surface of the metal portion, with said metal layer comprising a cobalt-based metal material; then siliciding the cobalt-based metal material of the metal layer, and nitriding the cobalt-based metal material of the metal layer.

In one advantage of this embodiment, the process allows for the formation of metal barriers which are self-aligning.

The copper atom diffusion blocking (for example) and antioxidation properties of the metal barrier are improved, even in comparison to a metal barrier which is silicided or nitrided but not both at once.

Another embodiment relates to a structural element of an integrated electronic circuit comprising at least a metal portion and a metal barrier of a cobalt-based metal material on top of the metal portion, with said material also comprising silicon atoms and nitrogen atoms located substantially on the surface.

Another embodiment relates to an interconnect structure of an integrated electronic circuit comprising at least one structural element as described above.

Another embodiment relates to a CMOS image sensor (imager) comprising at least one structural element as described above.

BRIEF DESCRIPTION OF THE DRAWINGS

Other features and advantages of the invention will become more clear upon reading the description which follows. This is purely illustrative and is to be read while referring to the attached drawings, in which.

DETAILED DESCRIPTION OF THE DRAWINGS

Figure 1:
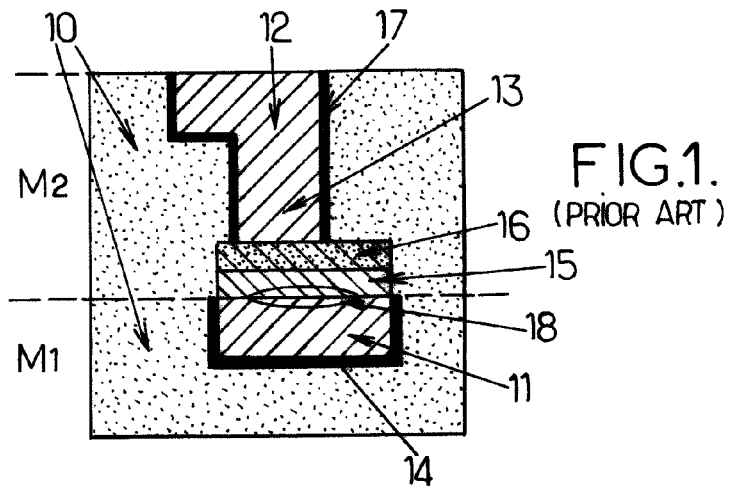
FIG. 1, already discussed, is a partial cross-section of an interconnect structure of a semiconductor product with two metallization layers during the fabrication process.
Figure 2:
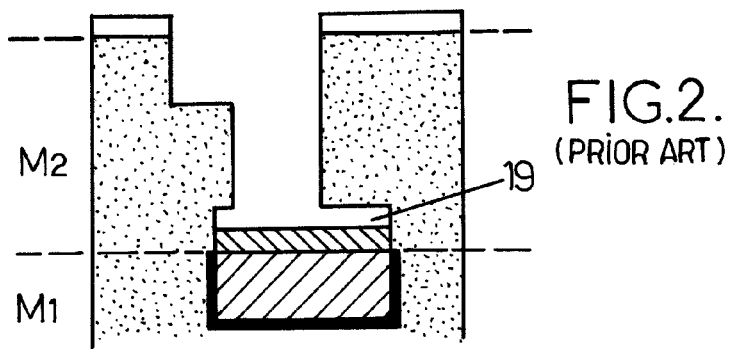
FIG. 2, also already discussed, is an equivalent view illustrating the formation of voids when a metal oxide layer on the surface of a metal barrier is removed by plasma.
Figure 3:
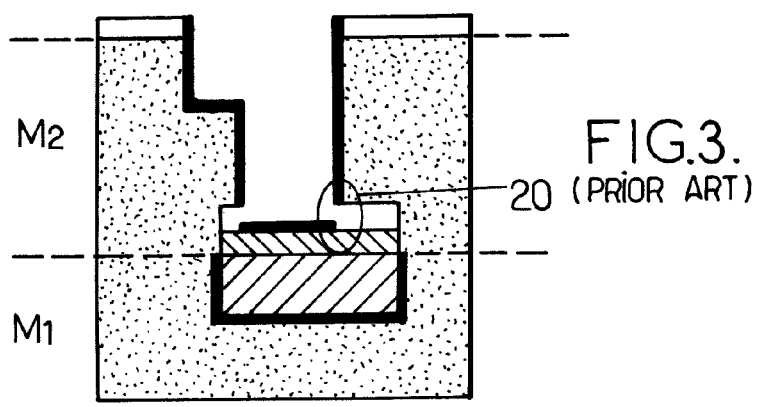
FIG. 3, also already discussed, is an equivalent view illustrating the integrity failure which may result in a metal cap.
Figure 4:
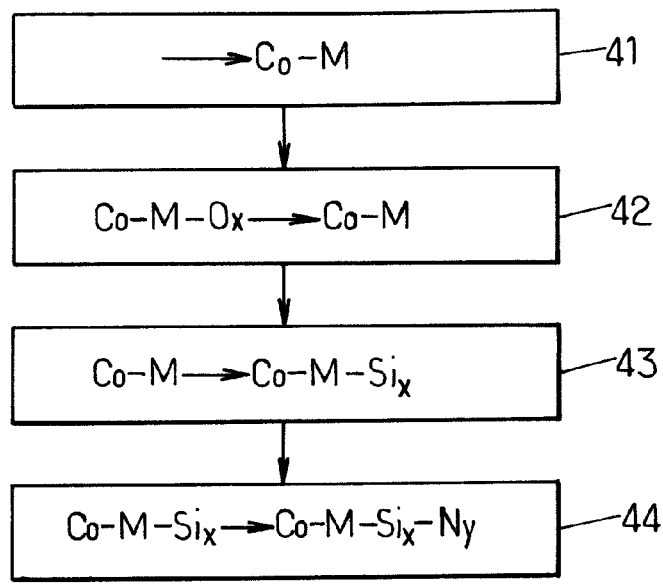
FIG. 4 is a diagram illustrating the steps in a process.

FIG. 4 is a flowchart showing an example of a metal barrier formation process. Such a metal barrier is, for example, intended for use in the passivation and/or encapsulation of a metal portion of a semiconductor wafer.

In the steps diagrammed in FIG. 4, the process comprises a step 41 where a metal layer comprising a cobalt-based metal material is formed on the surface of the metal portion in question. The process then comprises a deoxidation step 42, followed by a step 43 where the cobalt-based metal material of the metal layer is silicided and a step 44 where this metal material is nitrided.

These steps will now be detailed, with references to the diagrams in FIGS. 5a to 5h as well.

Figure 5A:
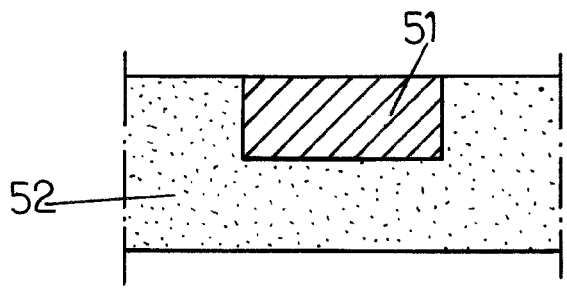
FIGS. 5a to 5h are cross-sections of a part of a semiconductor product which illustrate successive steps in the process.

It is assumed that a metal portion 51 has previously been realized by any appropriate process, inside a body 52 of a dielectric material, as illustrated in FIG. 5a. This metal portion can be a conductive path, a via, a contact terminal, etc., of a structure of a semiconductor product undergoing the fabrication process. It is generally of copper, but can be realized of aluminum or some other material. The dielectric material can be USG, TEOS, FSG, BD2, or some other material. The process for realizing such a portion can be the damascene process or its variant the dual damascene process, both well known to a person skilled in the art.

Figure 5B:
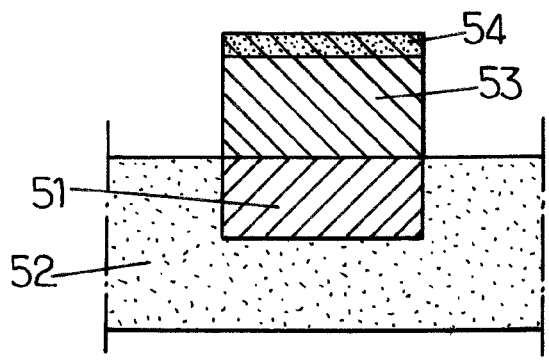

During the step 41, a layer 53 of cobalt-based metal material is deposited on top of the portion 51 (FIG. 5b). It is advantageous if this metal material is a compound of cobalt and one or more of the following elements: tungsten, phosphorus, or boron. Other elements, which may or may not be metals, can also be considered for use with cobalt in the combination of elements forming the material of the layer 53, such as titanium or tantalum for example. In the present description, this material is denoted Co-M, where M indicates an element or a combination of elements other than cobalt.

Given that the material Co-M is a metal, it is subject to oxidation, such that a metal oxide layer 54 may form, denoted Co-M-$O_x$ for convenience in the present description, on top of the layer 53 (also FIG. 5b). This oxidation occurs during exposure to ambient air, or because of exposure to ambient oxidants during later steps in the fabrication of the semiconductor product (for example, the steps of depositing and etching a layer of dielectric material on top of the covered portion 51 of the layer 53).

In case of such an oxidation, it is preferable to realize the deoxidation step 42, which in itself is not mandatory. In fact, if oxygen atoms remain on the surface of the copper portions, silicon dioxide molecules ($SiO_2$) form during the decomposition of the silane or disilane in the silicidation step 43, which prevents the diffusion of silicon atoms into the copper. The deoxidation step 11 deoxidizes the surface of the copper portions.

Figure 5C:
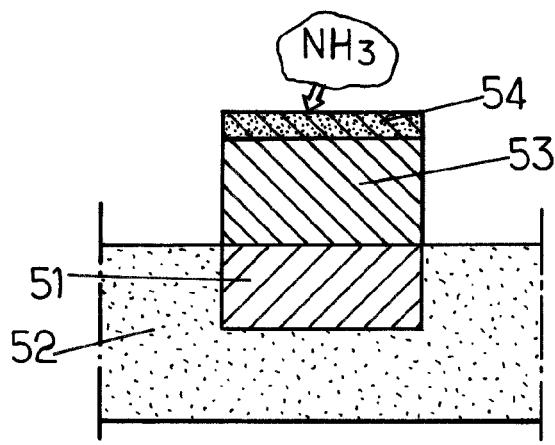
Figure 5D:
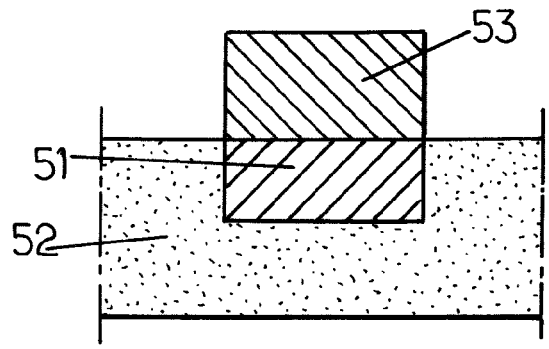

In the preferred embodiment illustrated in FIG. 5c, the deoxidation step 42 is realized using a plasma of ammonia ($NH_3$). Ammonia can be diluted in nitrogen ($N_2$) in order to reinforce the reactivity of the plasma. The ammonia plasma deoxidizes the surface of the copper portions. Thus, the configuration illustrated in FIG. 5d is obtained. It is advantageous if the wafer is kept in a vacuum in the reactor after this deoxidation step 42, which also avoids any contamination by the oxygen molecules in the ambient air.

In this embodiment, the deoxidation step 42 is preceded by a step (not illustrated) during which the wafer, once introduced into the reactor, is stabilized at the thermalization temperature.

In this example, the rector temperature is maintained at 400° C. during the deoxidation step 42.

After the deoxidation step 42, the gas used in said step is extracted from the reactor during a step (not illustrated) where it is pumped out (not illustrated).

The process is not limited by the manner in which the deoxidation step 42 is implemented, however. For example, the deoxidation may be achieved by reheating in hydrogen at 500° C., or by wet cleaning.

Figure 5E:
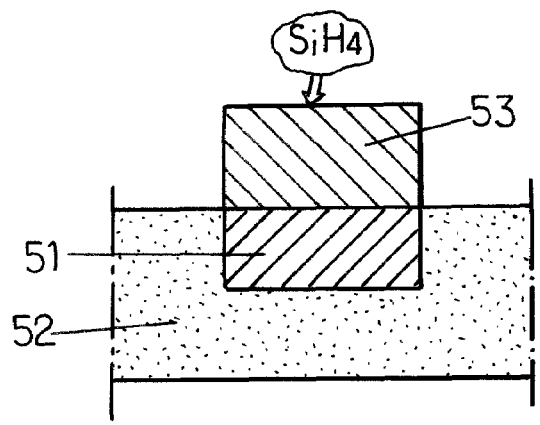
Figure 5F:
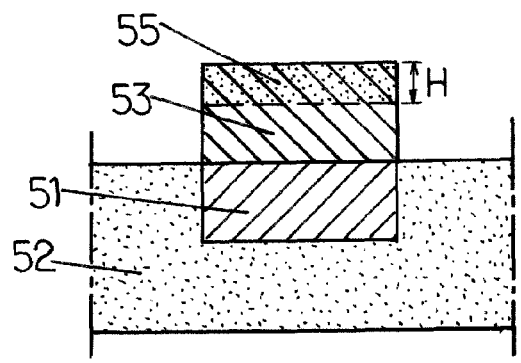
Figure 5G:
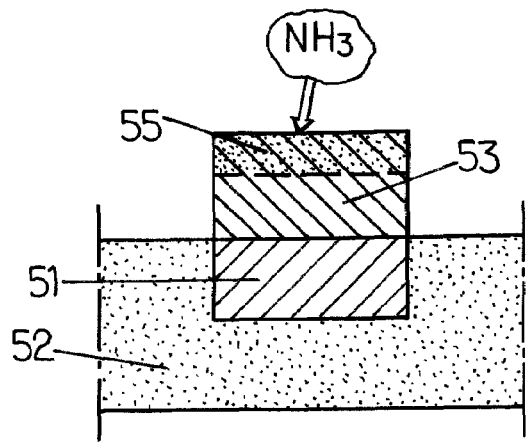
Figure 5H:
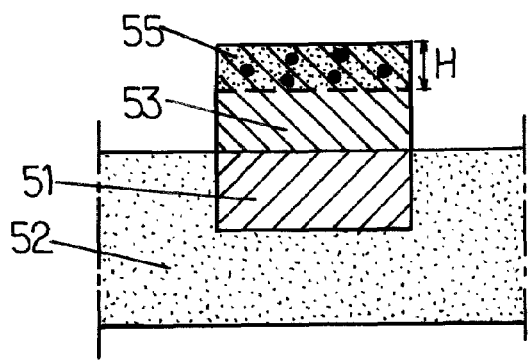

For realizing the silicidation step, a flow of silane gas ($SiH_4$) is introduced into the pressure chamber, with no plasma, as illustrated in FIG. 5e. The metal at the surface of the metal portion 51 acts as a catalyst in a silane decomposition reaction. The silane therefore decomposes selectively, meaning on the surface of the metal portion and not on the surface of the dielectric material surrounding it. Silicon (Si) atoms penetrate into the Co-M material to form a silicide of this Co-M material which is denoted Co-M-Si$_x$ material in the present description.

This silicidation step 43 is realized at a temperature of between 350° C. and 400° C. for example, and at a pressure of 2 to 5 Torr.

In one embodiment, the silane is diluted in nitrogen during the silicidation step. For example, silane can be diluted to 1% in nitrogen.

The thickness H of the metal barrier into which the silicon atoms diffuse is dependent on the duration of this silicidation step 43, as is illustrated in FIG. 5$f$ (where these atoms are represented by small dots in the upper part 55 of the layer 53). Typically, the duration of the step 43 is between about 10 seconds and about 60 seconds. A duration of about a minute may result in a thickness of about $2 \times 10^{-7}$ meters (2000 Å). A duration of about ten seconds may result in a thickness of about $3.6 \times 10^{-8}$ meters (360 Å).

The silicidation step 43 allows increasing the performance of the Co-M metal barrier in preventing the electromigration of copper atoms. Thus, if the conductive portion 51 is later exposed to high electrical currents, the diffusion of copper atoms into the surrounding dielectric material is decreased. This avoids the problem of short-circuits between metal portions which are supposed to remain isolated. In addition, the silicon atoms in the Co-M barrier allow increasing the antioxidation performance of the metal barrier.

However, in some embodiments of the invention, the nitridation step 44, combined with the silicidation step 43, further increases this performance.

In one embodiment illustrated in FIG. 5$g$, the nitridation step 44 is realized using a nitrogen RF plasma, meaning a plasma comprising nitrogen atoms. In the preferred embodiment, an ammonia plasma is used. Ammonia plasma is particularly reactive. Other nitrogen plasmas can of course be used, such as a dinitrogen plasma.

As is well known to a person skilled in the art, an RF (radiofrequency) plasma is a plasma generated at a frequency of 13.6 MHz.

The metal at the surface of the metal portion 53 acts as a catalyst in an ammonia decomposition reaction. The ammonia therefore decomposes selectively, meaning on the surface of the metal portion and not on the surface of the dielectric material surrounding it, and nitrogen atoms penetrate into the Co-M-Si$_x$ material to form a nitride of this Co-M-Si$_x$ material which is denoted Co-M-Si$_x$—N$_y$ material in the present description.

This nitridation step 44 is realized at a pressure of 2 to 5 Torr, typically 4.5 Torr, and at an RF power of about 500 W.

The thickness of the metal barrier into which the nitrogen atoms diffuse is dependent on the duration of this nitridation step 44. In the example illustrated in FIG. 5$h$ (where these N atoms are represented by large dots in the upper part 55 of the layer 53), this thickness corresponds to the penetration depth H of the Si atoms, but this is in no way a requirement. Typically, the duration of the step 44 is between about 10 sec and about 60 sec.

Other steps can of course then be applied to the wafer as required by the application, particularly a dielectric material deposition step.

Note that the order of the silicidation and nitridation steps is not limiting. In other words, the silicidation step 43 can be done first and then the nitridation step 44, as presented above and as has been successfully tested, but the reverse order can be done as well, with step 44 done first.

One could also realize the silicidation and nitridation at the same time, but in this case the process would no longer be selective. This loss of selectivity is not necessarily prohibitive, and may be acceptable in certain applications.

Density Profile

Due to the process enabling their insertion into the cobalt-based metal material, the silicon atoms and nitrogen atoms are essentially located on the surface of the Co-M layer.

The densities of atoms in a metal barrier realized according to some embodiments of the invention can be detected by analyzing the layer 53 of cobalt-based metal material, using a Secondary Ion Mass Spectrometry (SIMS) process, for example.

Figure 6:
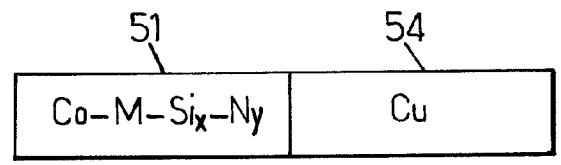
FIG. 6 is a density diagram representing an example of the concentration of the various atoms present in a metal barrier realized according to some embodiments.
Figure 6:
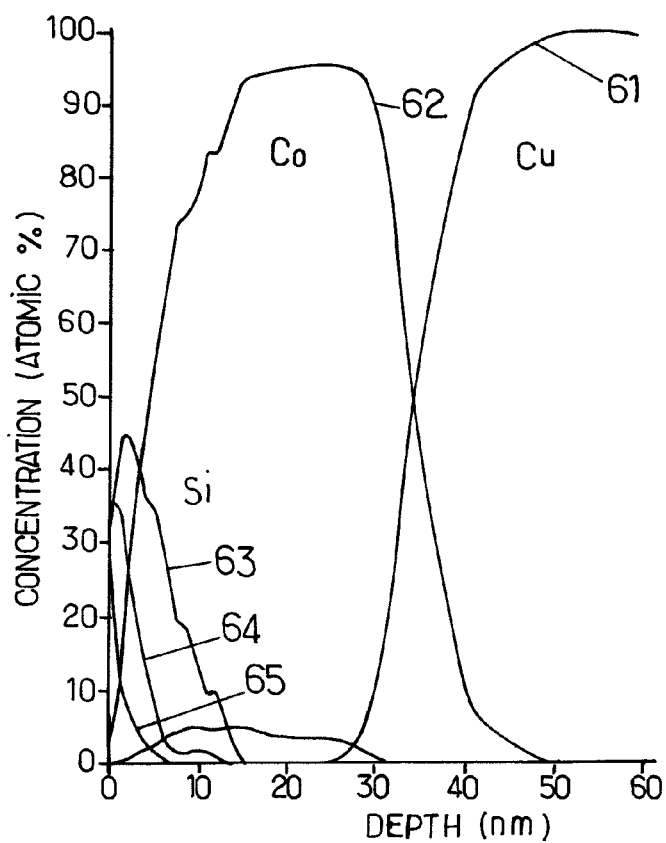

In the diagram in FIG. 6, where the superposition of the layer 53 onto the metal portion 51 is represented horizontally at the top for convenience, these densities are represented by curves.

These curves show the concentration of the various atoms (in atomic %) as a function of the depth (in nm). Thus the curve 61 corresponds to the concentration of copper atoms (when the portion 51 is of copper), the curve 62 corresponds to the concentration of cobalt, the curve 63 to the concentration of silicon atoms, and the curve 64 to that of nitrogen atoms.

As one can see, there is very little diffusion of the copper into the Co-M-Si$_x$—N$_y$. This explains the very good resistance of the metal barrier to the electromigration of copper atoms. In this example, nitrogen did not diffuse into the Co-M as far as silicon did. As was stated above, this relation depends on the respective parameters (particularly the duration) of the silicidation and nitridation steps.

In addition, the curve 65 corresponds to the concentration of oxygen atoms, and reveals the residual oxidation in the metal barrier. As can be seen, this oxidation is very weak, because a maximum of 30% of oxygen atoms are found on the surface, while only traces of oxygen are found starting at a depth of about 5 nm.

Improvement of Antioxidation Properties

Figure 7:
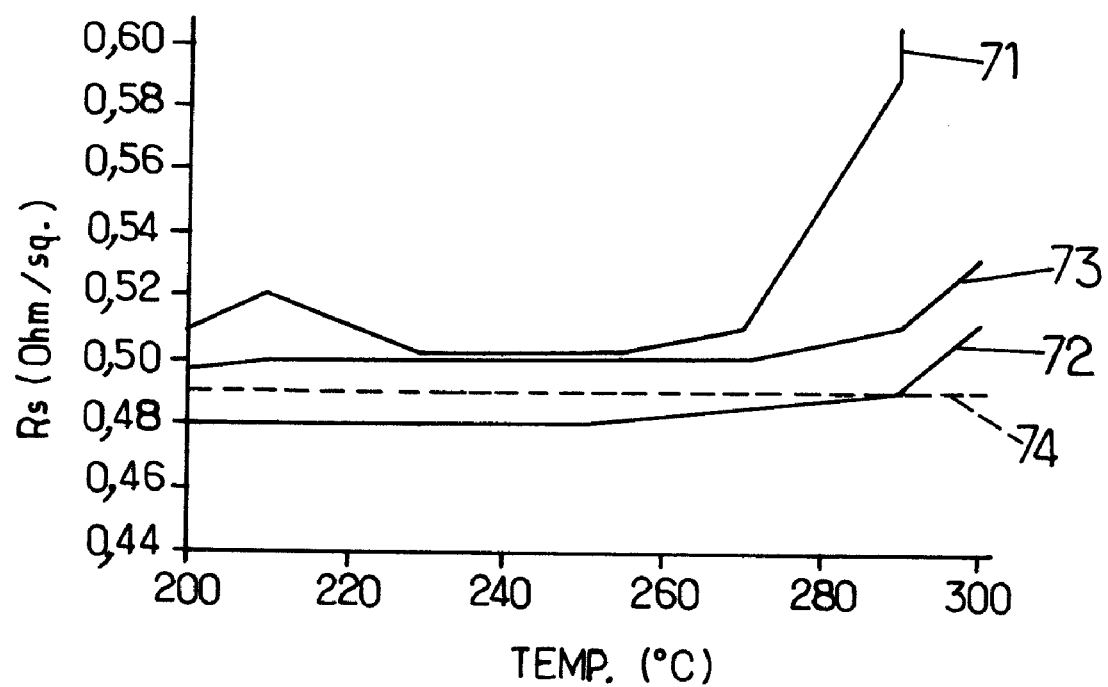
FIG. 7 is a diagram illustrating the improvement in the antioxidation properties of a metal barrier.

FIG. 7 uses actual measurements to illustrate the improvement in the antioxidation properties of the metal barrier.

FIG. 7 shows the evolution in the resistance Rs (in ohms/square) of a metal portion protected by a metal barrier, as a function of the application temperature (in ° C.) of an RF plasma of oxygen (O$_2$) at a power of 500 W. The application of this plasma simulates a natural oxidation process whose intensity increases with the temperature.

Thus, the curve 71 corresponds to the resistance Rs with a metal barrier of Co-M (without silicidation or nitridation). The curve 72 corresponds to the resistance Rs with a metal barrier of Co-M-Si$_x$ (with silicidation but without nitridation). The curve 73 corresponds to the resistance Rs with a metal barrier of Co-M-Si$_x$ (with more silicidation but still no nitridation). And the curve 74 corresponds to the resistance Rs with a metal barrier of Co-M-Si$_x$—N$_y$ (with silicidation and nitridation).

The increase in the resistance Rs as the plasma temperature increases reveals the sensitivity of the metal barrier's material to oxidation.

It can be seen that for temperatures of between 250 and 300° C., the resistance Rs of the Co-M greatly increases, while that of the Co-M-Si$_x$ increases less (the greater the silicidation of the Co-M, the less the increase) and that of the Co-M-Si$_x$—N$_y$ remains constant.

This clearly demonstrates the better antioxidation properties of the metal barrier realized according to embodiments of the invention (curve 74).

Examples of Applications in Semiconductor Products

Figure 8:
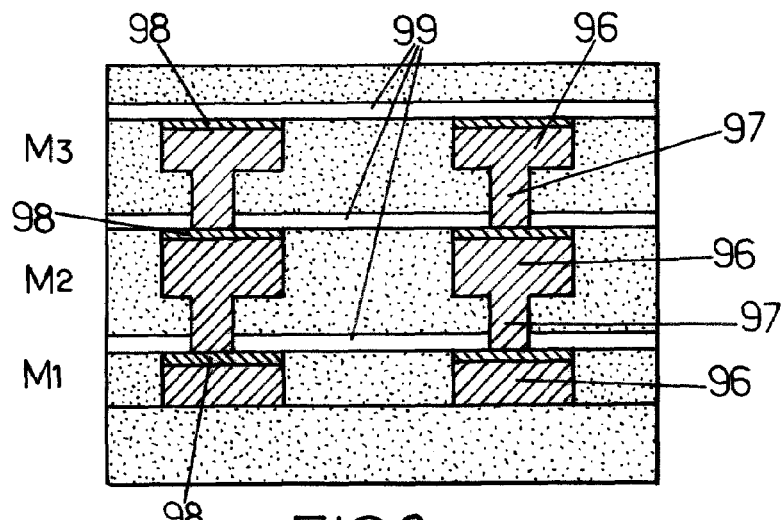
FIG. 8 is a cross-section of a structural element of a semiconductor product comprising metal barriers.
Figure 9:
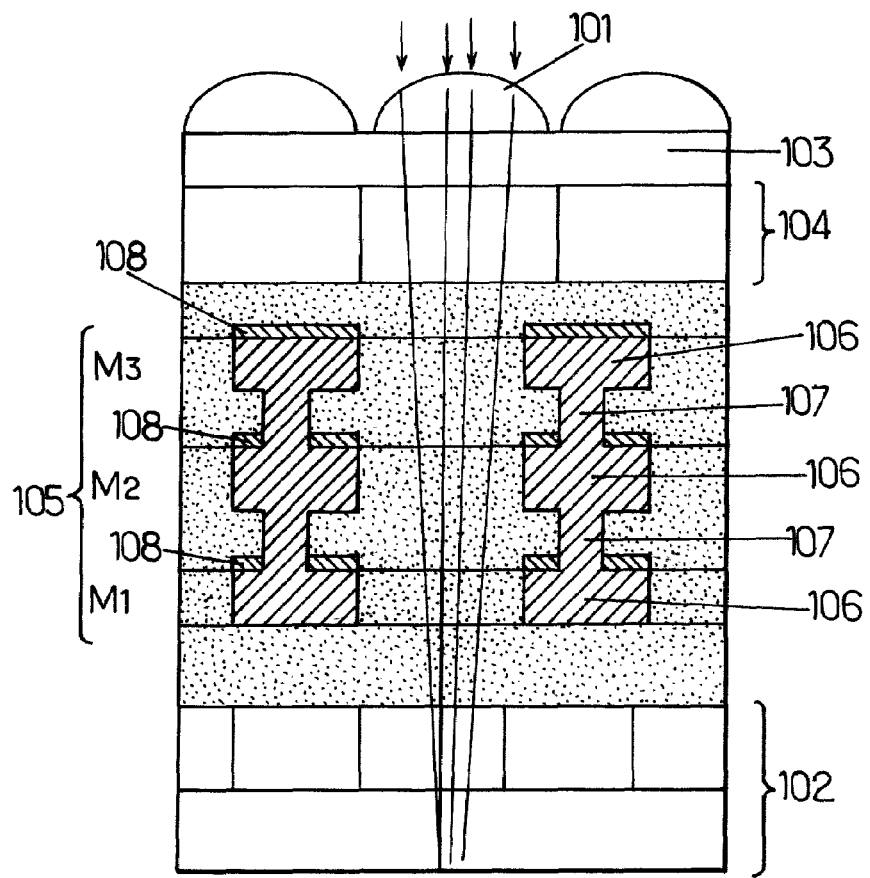
FIG. 9 is a partial cross-section of a first structure of a semiconductor product comprising metal barriers.

FIGS. 8 and 9 show examples of semiconductor products comprising self-aligned metal barriers obtained according to embodiments of the invention.

FIG. 8 shows an interconnect structure comprising a plurality of metallization levels M1, M2 and M3. Each of the metallization levels of the interconnect structure comprises, for example, a layer of undoped silicon glass (USG) in which is realized at least one conductive line 96 which is of copper, for example.

Conductive lines 96 in separate metallization levels can be connected by vias 97.

Metal barriers 98 with two layers of copper silicide obtained according to embodiments of the invention are situated between the copper portions constituted by the conductive paths 96 and the dielectric material of the interconnect structure 105. It is advantageous for these metal barriers 108 to be deposited in a self-aligned manner on the copper portions only.

In this example, the vias come into electrical contact with the metal portion of the inferior conductive line to which they are connected, by means of the corresponding conductive barrier. In other words, the metal of the via is deposited onto the conductive barrier covering the metal portion with which contact will be established, not directly on said portion.

In the embodiment represented, at least a part of the metallization layers comprises an intermetallic layer 99, or insulating layer, for example of silicon nitride ($Si_3N_4$). In this case, the intermetallic layer or layers can be realized on top of the metal barriers 98 of the corresponding metallization layer. Openings are created in it or them to ensure electrical contact, by an ad hoc etching process before the realization of the vias.

FIG. 9 shows an example of a part of an image sensor (imager), which can be a CMOS image sensor for example. The imager portion 100 represented comprises a microlens 101 and a photodiode 102. A beam of light, represented by vertical arrows, is deflected by the microlens and travels to the photodiode 102 after traversing several transparent layers. The traversed layers may comprise a planarization and/or passivation layer 103, a film 104 with color filters, and a plurality of metallization levels M1, M2 and M3 of an interconnect structure 105 for controlling and reading the photodiode.

Each of the metallization levels of the interconnect structure 105 comprises, for example, a layer of undoped silicon glass (USG) in which is realized at least one conductive line 106 which is of copper for example, but not at a right angle to the conductive channel of the photodiode 102. Conductive lines 106 in separate metallization levels can be connected by vias 107.

Metal barriers 108 with two layers of copper silicide, obtained according to the process embodiments described herein, are placed between the copper portions 106 and the dielectric material of the interconnect structure 105. It is advantageous if these metal barriers 108 are deposited in a self-aligned manner on the copper portions 106 only. The beams of light do not cross the self-aligned barriers and are thus guided towards the photodiode 102.

The metal barriers prevent electromigration of copper atoms from one metallization level to another, and thus avoid the risk of a short circuit between conductive paths which are not supposed to be connected.

In the example represented, note that the metal barriers were etched to expose a part of the underlying metal portion corresponding to a via intended for connecting this metal portion, before the deposition of the metal constituting the via. In this manner the via is in direct contact with said metal portion. This measure can be considered when there is no fear of oxidation of the copper exposed by the opening etched in the barrier.

Although preferred embodiments of the method and apparatus have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A method of forming a metal barrier, comprising:
   forming a metal portion of a semiconductor product;
   forming a metal layer on a surface of the metal portion, with said metal layer comprising a cobalt-based metal material; and then:
   siliciding the cobalt-based metal material of the metal layer; and
   nitriding the cobalt-based metal material of the metal layer.

2. The method according to claim 1, wherein siliciding and nitriding are separately performed.

3. The method according to claim 2, wherein siliciding is performed before nitriding.

4. The method according to claim 1, wherein siliciding and the nitriding are preceded by deoxidation to deoxidize the metal layer comprising the cobalt-based metal material.

5. The method according to claim 4, wherein deoxidation is performed using a nitrogen plasma.

6. The method according to claim 1, wherein siliciding is performed using a silane and/or disilane flow under pressure.

7. The method according to claim 6, wherein the silane and/or disilane are diluted in dinitrogen during siliciding.

8. The method according to claim 1, wherein nitriding is performed using a nitrogen plasma.

9. The method according to claim 8, wherein the nitrogen plasma comprises an RF plasma of ammonia.

10. The method of claim 1 wherein nitriding is performed before siliciding.

11. The method of claim 1 wherein nitriding and siliciding are performed simultaneously.

12. A method, comprising:
    forming a metal portion inside a body of dielectric material and having an exposed top surface;
    depositing a layer of cobalt-based metal material on the exposed top surface;
    siliciding the layer of cobalt-based metal material to form a metal barrier; and
    nitriding the metal barrier.

13. The method of claim 12 wherein the cobalt-based metal material is compound of cobalt and an element selected from the group consisting of tungsten, phosphorous and boron.

14. The method of claim 12 wherein the metal barrier has a thickness including diffused silicon atoms of between about 360 and 2000 Angstroms.

15. The method of claim 12 wherein nitriding diffuses nitrogen atoms into the metal barrier.

16. The method of claim 12 further comprising, after depositing and before siliciding or nitriding, deoxidation of the layer of cobalt-based metal material.

17. A method, comprising:
    forming a metal portion inside a body of dielectric material and having an exposed top surface;
    depositing a layer of cobalt-based metal material on the exposed top surface;
    simultaneously siliciding and nitriding the layer of cobalt-based metal material to form a metal barrier.

* * * * *